US006810066B2

United States Patent
Baney et al.

(10) Patent No.: US 6,810,066 B2
(45) Date of Patent: Oct. 26, 2004

(54) FIBER-COUPLED TUNABLE SINGLE-MODE LONG-WAVELENGTH VERTICAL-CAVITY LASER

(75) Inventors: Douglas M. Baney, Los Altos, CA (US); Dubravk I. Babic, Pal Alt, CA (US); Wayne V. Sorin, Mountain View, CA (US); Jonathan Lacey, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 184 days.

(21) Appl. No.: 10/081,071

(22) Filed: Feb. 20, 2002

(65) Prior Publication Data

US 2003/0156617 A1 Aug. 21, 2003

(51) Int. Cl.[7] .................................................. H01S 3/08
(52) U.S. Cl. .............................. 372/96; 372/43; 372/45; 372/50
(58) Field of Search ............................... 372/96, 45, 43, 372/50

(56) References Cited

U.S. PATENT DOCUMENTS

| 6,195,188 | B1 | * | 2/2001 | Sekiguchi | ................... | 398/152 |
| 6,493,090 | B1 | * | 12/2002 | Lading et al. | ............... | 356/484 |
| 6,535,541 | B1 | * | 3/2003 | Boucart et al. | ................ | 372/96 |
| 2002/0181908 | A1 | * | 12/2002 | Pedersen et al. | ............ | 385/123 |
| 2003/0039024 | A1 | * | 2/2003 | Clayton et al. | ............. | 359/326 |
| 2003/0133657 | A1 | * | 7/2003 | Kochergin et al. | ............ | 385/37 |

* cited by examiner

Primary Examiner—Don Wong
Assistant Examiner—Dung T Nguyen

(57) ABSTRACT

A light source for generating and coupling light from a first wavelength into an optical fiber. The light source includes an output laser having a first optical cavity that includes a bottom mirror located outside of the optical fiber, and a top mirror that includes a reflector located within the optical fiber. An active region between the top and bottom mirrors generates light of the first wavelength, preferably through optical pumping at a second wavelength. The reflector is preferably a Bragg reflector and may include a mechanism for altering the wavelength of the light reflected thereby as well as the distance between the top and bottom mirrors. The pumping light is preferably generated by a pumping laser that includes a second electrically pumped optical cavity having a top mirror that is electrically connected to the bottom mirror of the first optical cavity.

10 Claims, 4 Drawing Sheets

FIBER-COUPLED TUNABLE SINGLE-MODE LONG-WAVELENGTH VERTICAL-CAVITY LASER

FIELD OF THE INVENTION

The present invention relates to lasers, and more particularly, to a laser that is adapted for high-speed single mode optical fiber communications.

BACKGROUND OF THE INVENTION

The main application for long-wavelength vertical cavity surface emitting lasers (VCSELs) is in high-speed single mode optical fiber-based communications. The key performance issues required for 1310 nm and 1550 nm single mode sources for optical communications are: single mode operation over a sufficient output power range (typically 1 mW) and wavelength and polarization stability over temperature and bias variations. In addition, the ability to tune the output wavelength is a highly desired feature for optical sources to be used in discrete wavelength multiplexed communications systems.

Tunable VCSEL sources in the 1310 nm and 1550 nm wavelength range are well known in the art. However, all of these devices are less than ideal. For example, one class of VCSEL is electrically pumped with the tuning realized using a movable membrane. However these devices have only been successfully demonstrated at 980 nm and 850 nm. At longer wavelengths, numerous technological difficulties have prevented commercial devices from being fabricated.

VCSELs that are optically pumped by 980 nm edge-emitting lasers are also known to the art. These devices are also tuned using a movable membrane. However, the cost associated with the multiple fiber to waveguide couplings and the cost associated with the 980 nm pump laser add to the cost of the device. As yet, the cost of these devices has prevented their commercial development for optical networks.

Fiber-Fabry-Perot Surface-Emitting lasers that are optically pumped with a pigtailed 980 nm laser have also been demonstrated. These devices are tuned via a piezoelectrically controlled cavity mirror. However, these devices are also economically unattractive because of the cost of the fiber to laser coupling and the extra cost of the fiber-coupled 980 nm laser pump.

Broadly, it is the object of the present invention to provide an improved long-wavelength light source.

These and other objects of the present invention will become apparent to those skilled in the art from the following detailed description of the invention and the accompanying drawings.

SUMMARY OF THE INVENTION

The present invention is a light source for generating and coupling light from a first wavelength into an optical fiber. The light source includes an output laser having a first optical cavity that includes a bottom mirror located outside of the optical fiber, and a top mirror that includes a reflector located within the optical fiber. An active region between the top and bottom mirrors generates light of the first wavelength, preferably through optical pumping of an active region in the first optical cavity at a second wavelength. The reflector is preferably a Bragg reflector and may include a mechanism for altering the wavelength of the light reflected thereby as well as the distance between the top and bottom mirrors. A pumping laser that includes a second optical cavity having a top mirror, active region, and bottom mirror preferably generates the pumping light. The top mirror of the pumping laser is electrically connected to the bottom mirror of the first optical cavity, and the active region of the pumping laser generates light in response to an electrical current passing therethrough. The top mirror of the pumping laser may be located on an end of the optical fiber. Embodiments of the present invention in which the output laser is electrically pumped can also be constructed.

DETAILED DESCRIPTION OF THE INVENTION

Figure 1:
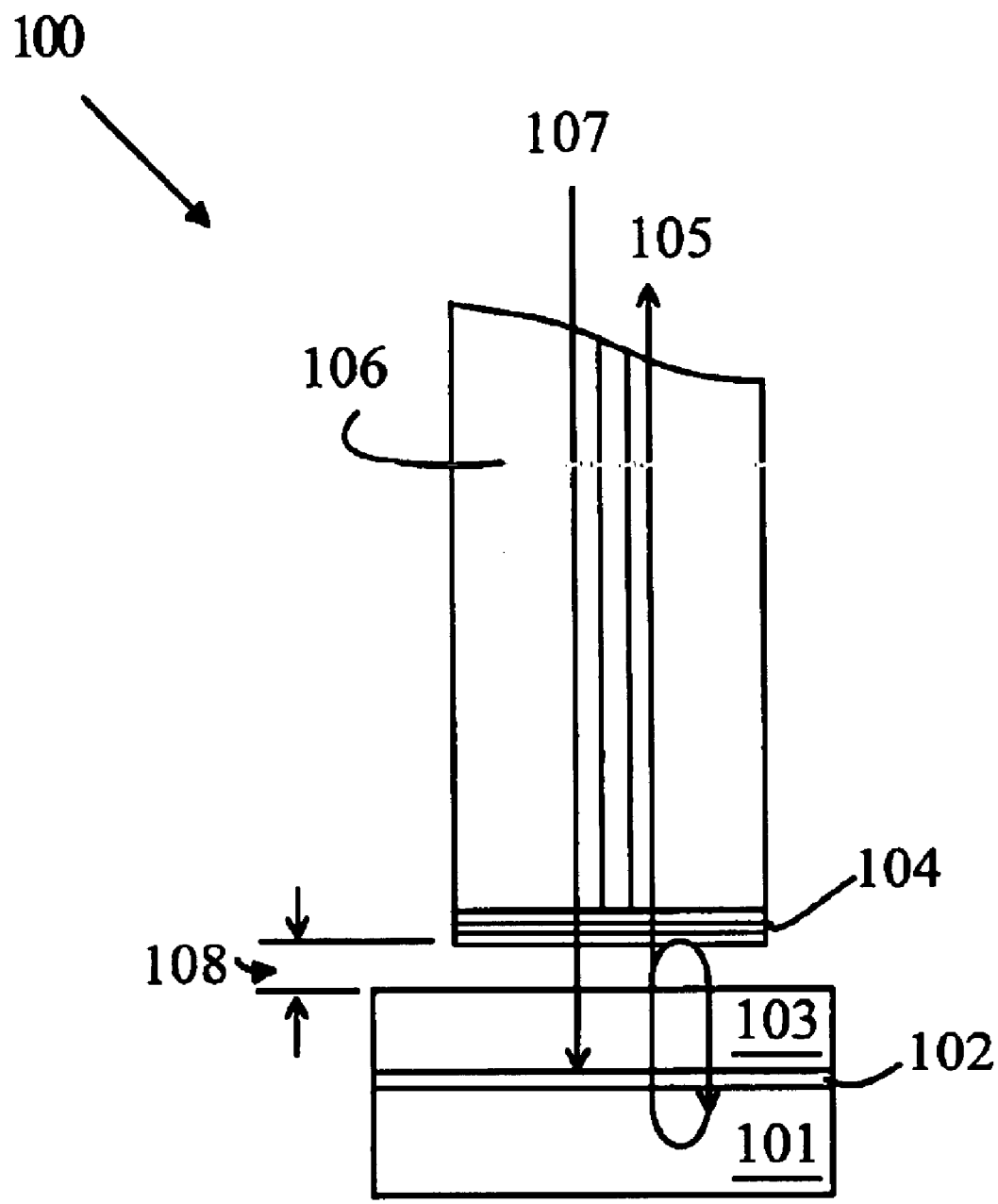
FIG. 1 illustrates a prior art VCSEL coupled to an optical fiber.

The manner in which the present invention provides its advantages can be more easily understood with reference to the prior art VCSEL shown in FIG. 1 at 100. In laser 100, one of the mirrors that form the laser cavity is constructed on the end of the output fiber. Typically, single mode fiber 106 has a cleaved edge which is coated with a high-reflectivity dielectric mirror 104 having a center wavelength tuned to the desired center wavelength of the tunable source (1310 nm/1550 nm). Although the dielectric mirror is a narrow-band mirror, the high-reflectivity region is still much larger than the desired tuning range of the source. A short-wavelength laser source having an output wavelength of 980 nm is coupled into the single mode fiber. Mirror 104 is transparent to the short-wavelength light. To simplify the drawing, the pumping laser is not shown. The output light 107 from the pumping laser is used to optically pump the long-wavelength active layer 102. Laser 100 also includes a bottom mirror which completes the long wavelength laser cavity consisting of the bottom mirror 101, the top mirror 104, the cladding layer 103, and the air gap 108. The wavelength of the long-wavelength laser output 105 is tuned by changing the optical length of the long-wavelength cavity. The output wavelength is tuned by changing the fiber to cladding separation 108.

The arrangement shown in FIG. 1 has two problems. First, the cost of providing mirror 104 on the end of fiber 106 is significant. Second, only a portion of the light generated in the long-wavelength cavity is coupled into the fiber mode in practice. If fiber 106 is a single mode fiber, the required alignment tolerances are very high. Any small misalignment reduces the amount of light that is coupled into the fiber. Hence, the efficiency of the laser coupling system and the maximum power output are less than ideal. Additionally, the efficiency of the laser is decreased because reflectivity exits over regions of the fiber facet that are not useful in generating light in the exiting mode of the output laser.

Figure 2A:
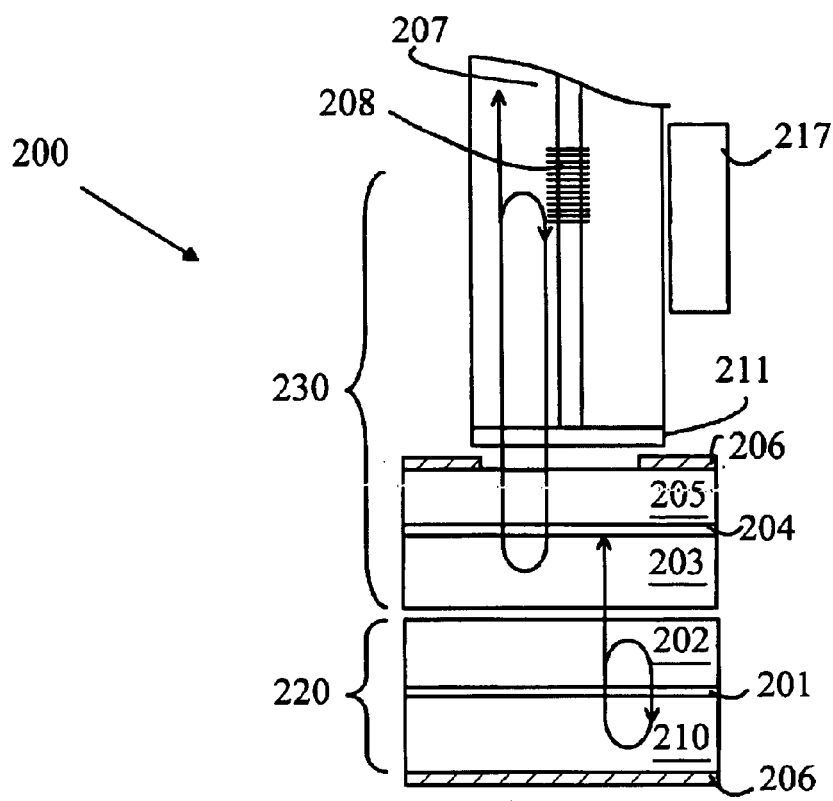
FIGS. 2A and B are cross-sectional views of embodiments of optical sources according to the present invention.
Figure 2B:
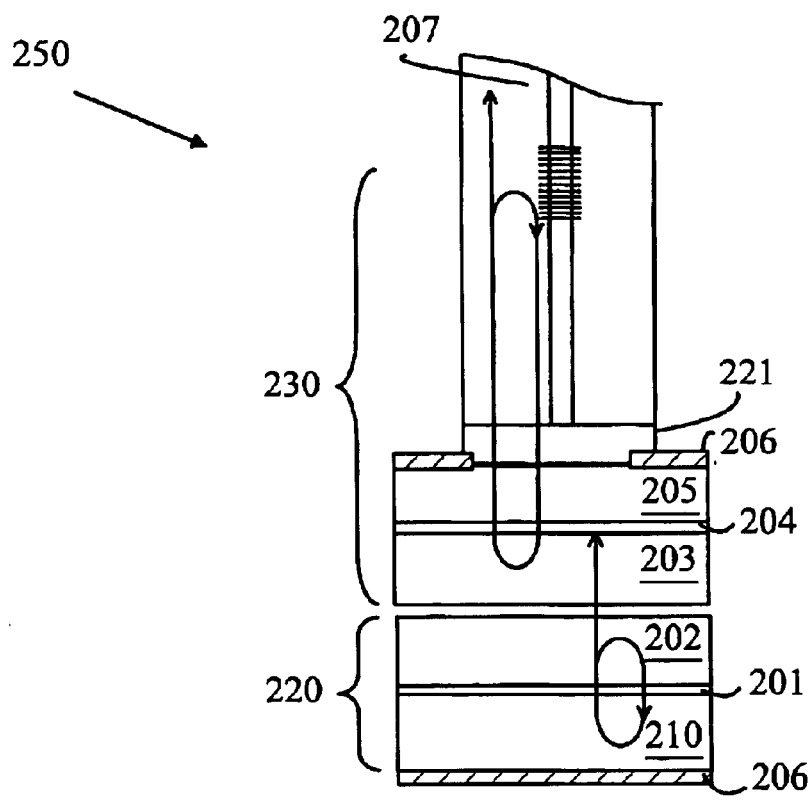

The present invention avoids these problems by utilizing a top mirror that is formed in the optical fiber itself. Refer now to FIGS. 2A–B, which are cross-sectional views of embodiments of optical sources according to the present invention. FIG. 2A is a cross-sectional view of a fixed-wavelength optical source 200. This embodiment of the present invention includes a short-wavelength laser that pumps a long-wavelength laser. The long-wavelength laser utilizes a top mirror 208 that is formed in the optical fiber. Top mirror 208 is preferably a Bragg reflector. Since fiber Bragg reflectors are well known to the art, they will not be discussed in detail here. For the purpose of the present discussion, it is sufficient to note that a fiber Bragg reflector may be viewed as a grating that has been induced in the core of an optical fiber. The grating consists of periodic alterations in the index of refraction of the core of the fiber. Such alterations may be induced by illuminating the core with a UV light pattern having regularly spaced maxims of sufficient intensity to damage the core. The pattern is typically generated by the interference of two UV light beams.

When light having a wavelength twice the spacing of the grating strikes the grating, the light is reflected because of the coherent interference of the various partial reflections created by the alterations in the index of refraction of the fiber core. The wavelength at which the reflection occurs may be varied over a small range of wavelengths by varying the optical path length between the periodic alterations in the index of refraction. This may be accomplished by heating the fiber or by stretching the fiber. A fiber Bragg reflector which accepts an input control signal which activates a heating or stretching system associated with the reflector will be referred to as a variable frequency Bragg reflector in the following discussion.

The short-wavelength resonator 220 includes an active layer 201, a bottom mirror 210, and a top mirror 202. The short-wavelength resonator outputs short-wavelength light towards the long-wavelength cavity where the short-wavelength light is absorbed by active layer 204 and creates gain. The long-wavelength resonator 230 also includes a bottom mirror 203, active layer 204, and output coupler 205. The output of the long-wavelength cavity is coupled into the single mode fiber 207. The electrical pumping of the short-wavelength laser is accomplished by using tip contacts 206.

It should be noted that the location in active layer 204 at which the stimulated gain is created is defined by the location of the fiber, and hence, the lasing mode of the long-wavelength laser is self-aligned with the fiber. It should also be noted that the alignment of the fiber to the electrically pumped area of the short-wavelength laser does not need to be very accurate. The electrically pumped area needs to cover the region of active layer 204 that is illuminated by Bragg reflector 208. An optimum can be found between the more tolerant coupling which corresponds to lower electrical efficiency (wider pump area), and less tolerant fiber coupling which corresponds to higher electrical efficiency (smaller pumping area).

To remove spurious reflections on the fiber end, the end is preferably coated with an anti-reflection coating 211. Alternatively, an index-matching gel can be introduced between the end of fiber 207 and the top of cladding layer 205 as shown in FIG. 2B at 221. The remaining elements in optical source 250 shown in FIG. 2B are the same as the corresponding elements shown in FIG. 2A.

As noted above, the Bragg reflector may include a mechanism for heating or stretching the fiber as shown at 217 in FIG. 2A. In general, the spacing between the Bragg mirror and the bottom mirror must be altered when the spacing between the periodic alterations of the Bragg reflector is altered to tune the long-wavelength laser so that the optical cavity has a resonance at the new reflection wavelength. This can be accomplished by moving the fiber end. The mechanism for altering the mirror spacing may also be included in mechanism 217. For example, the region of the fiber between the Bragg reflector and the end of the fiber may also be stretched. Alternatively, the air gap between the end of the fiber and layer 205 can be altered by moving the fiber. Such tuning does not alter the wavelength of the pump laser in the embodiments shown in FIGS. 2A and 2B.

Figure 3:
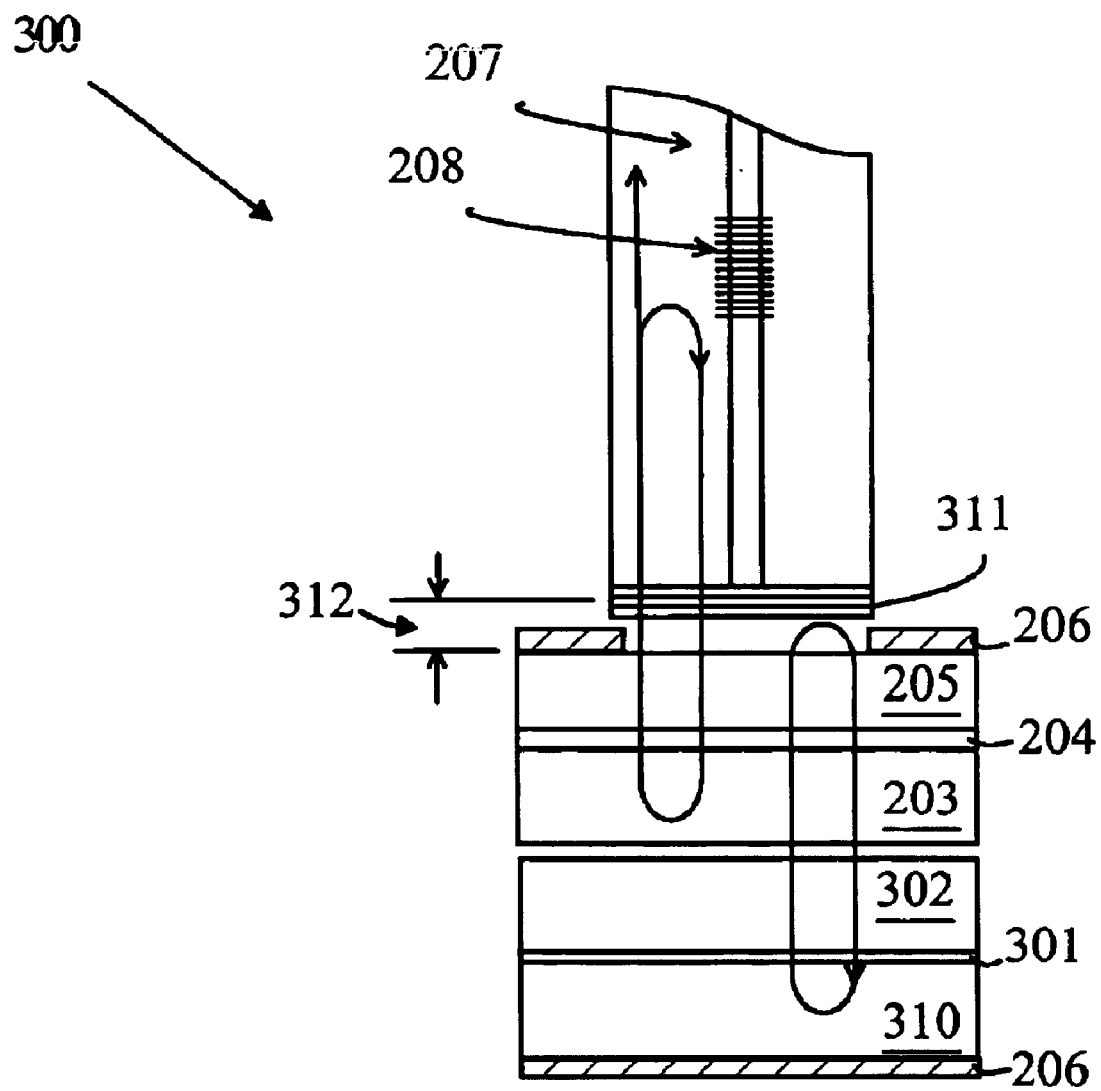
FIG. 3 is a cross-sectional view of an optical source 300 according to the present invention in which the wavelength of the pump laser can also be tuned.

Embodiments in which the wavelength of the pump laser is altered can also be practiced. Refer now to FIG. 3, which is a cross-sectional view of an optical source 300 according to the present invention, in which the wavelength of the pump laser can also be tuned. To simplify the following discussion, those elements of optical source 300 that serve the same function as elements shown in FIG. 2A have been given the same numeric designations and will not be discussed further here. Optical source 300 includes a pump laser that is electrically pumped. The pump laser includes a bottom mirror 310, an active region 301, and a cladding layer 302. In optical source 300, the top mirror of the pumping laser has been moved to the end of fiber 207 as shown at 311. As in the previously described embodiments, the short-wavelength laser lases at the location where the fiber is located, and hence, the gain region is exactly aligned with the fiber. The long-wavelength lases at the same spot. Both wavelengths can be tuned by altering the air gap 312 provided the reflection wavelength of the Bragg reflector is also altered.

The difference in wavelengths between the long wavelength laser and the pumping source must be sufficient to allow the light generated by each source to pass through the mirrors associated with the other source. For example, the light from the pumping laser must pass through the bottom mirror of the long wavelength laser to reach the active region of that laser. Similarly, the long wavelength laser must pass through mirror 311 in the embodiment shown in FIG. 3. This is not a problem for conventional VCSEL mirrors provided the long and short wavelengths are sufficiently different from one another.

The above-described embodiments of the present invention utilize two stacked lasers. However, embodiments of the present invention in which the pumping laser is in a location remote from the long-wavelength laser and coupled to the long wavelength laser via the optical fiber can also be practiced. Such embodiments would be similar to the optical source shown in FIG. 1 with the top mirror of the laser being replaced by a Bragg reflector in the optical fiber. Such an embodiment would provide the benefits of the self-aligned coupling of the long-wavelength laser to the single mode of the optical fiber.

Figure 4:
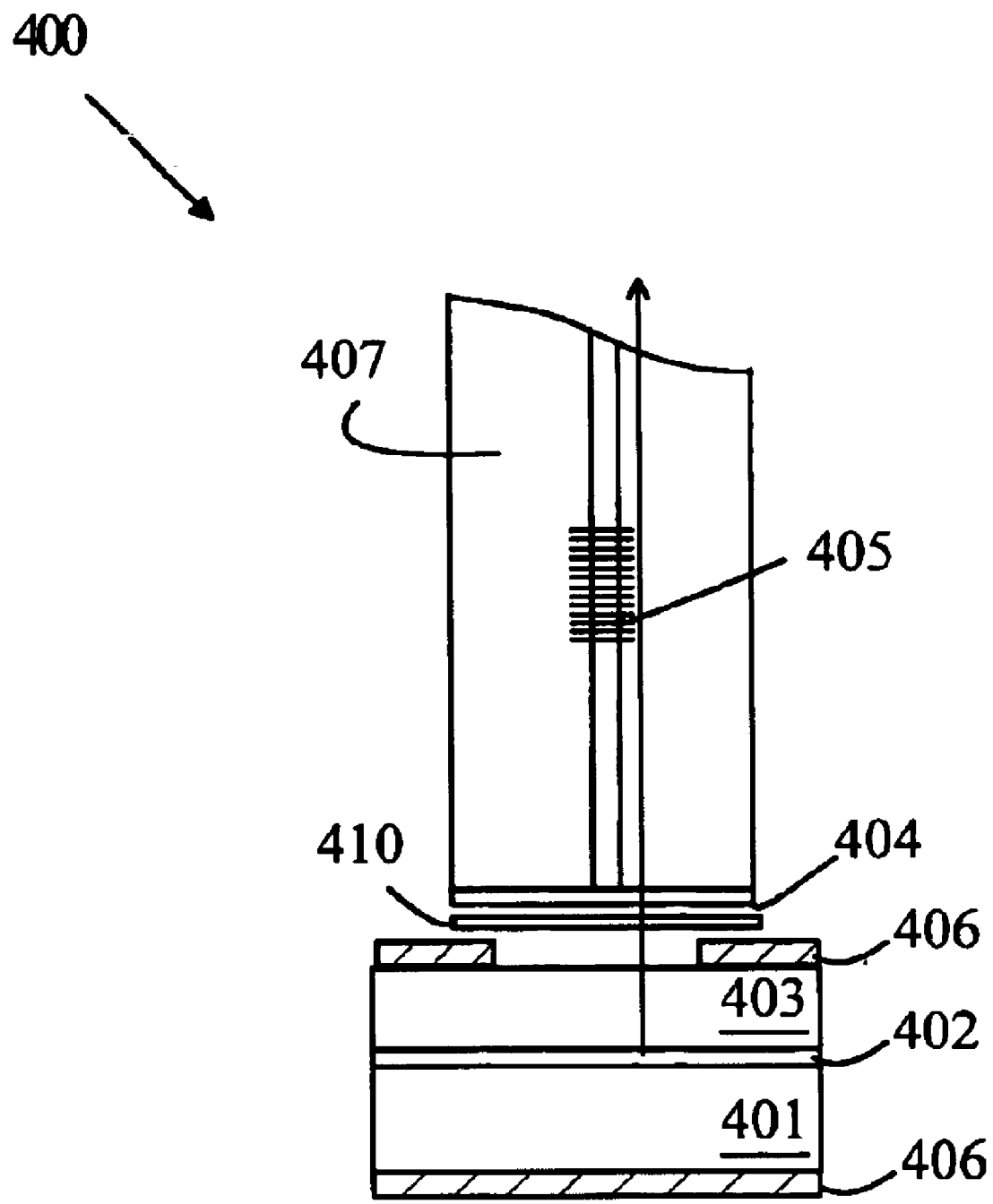
FIG. 4 is a cross-sectional view of an optical source 400 according to the present invention in which the output laser is electrically pumped.

The present invention may also be utilized in a single laser configuration in which the output laser is electrically pumped. Refer now to FIG. 4, which is a cross-sectional view of an optical source 400 according to the present invention in which the output laser is electrically pumped. Optical source 400 includes a Bragg reflector 405 in output fiber 407. Bragg reflector 405 and bottom mirror 401 form the optical cavity for the output laser. The output laser is electrically pumped by applying a potential between the contacts shown at 406. This potential causes a current to flow through the optically active region 402 in the area below the core of fiber 407. Region 403 may include regions of high resistivity to further funnel the current to the desired region if electrodes 406 do not provide sufficient current confinement. An anti-reflecting coating 404 may be utilized on the fiber facet to assure that the facet does not define a second cavity by reflecting a portion of the light.

It should be noted that the wavelengths at which the Bragg reflector has significant reflectivity will define the output wavelength of the optical source. In general, the distance between the Bragg reflector and the bottom mirror will be very large compared to the wavelength of light generated by the source. Hence, there will always be a laser mode within the reflectivity range of the Bragg reflector. Accordingly, precise positioning of the Bragg reflector relative to the bottom mirror is not required.

It should be noted that the present invention can be modified to provide a light source having a fixed polarization. To provide such a source, the optical fibers must be polarization-maintaining fibers. In addition, a polarization filter 410 to select the desired polarization must be introduced into the optical cavity. The polarization filter may be included in the anti-reflective coating on the fiber facet.

The above-described embodiments of the present invention refer to "top" and "bottom" mirrors. However, it is to be understood that these are merely labels for distinguishing between the mirrors and do not imply any particular orientation in space.

The above-described embodiments of the present invention utilize a Bragg reflector that has been generated in an optical fiber. However, the present invention may also be practiced with non-fiber waveguides. For example, the present invention may be constructed using a planar waveguide having a Bragg reflector therein.

Various modifications to the present invention will become apparent to those skilled in the art from the foregoing description and accompanying drawings. Accordingly, the present invention is to be limited solely by the scope of the following claims.

What is claimed is:

1. A light source for generating and coupling light of a first wavelength into an optical waveguide, said light source comprising:

an optical cavity comprising a bottom minor located outside of said optical waveguide, and a top mirror comprising a reflector located within said optical waveguide; and an active region between said top and bottom mirrors for generating light of said first wavelength, said light source further comprising a polarization filter between said top and bottom mirrors.

2. The light source of claim 2 wherein said optical waveguide is an optical fiber.

3. The light source of claim 2 wherein said reflector is a Bragg reflector.

4. A light source for generating and coupling light characterized by a wavelength into an optical waveguide, said light source comprising:

an optical cavity comprising a bottom mirror located outside of said optical waveguide, and a top mirror comprising a reflector located within said optical waveguide; and an active region between said top and bottom mirrors for generating light of said wavelength, wherein said reflector is a Bragg reflector, said optical waveguide is an optical fiber, and wherein said Bragg reflector further comprises a mechanism for altering the wavelength of the light reflected thereby.

5. The light source of claim 4 wherein said mechanism also alters the distance between said top and bottom mirrors.

6. The light source of claim 2 wherein said active region generates light by absorbing light of a second wavelength.

7. The light source of claim 6 further comprising a pumping laser for generating light of said second wavelength.

8. The light source of claim 6 wherein said bottom mirror is transparent to light of said second wavelength.

9. A light source for generating and coupling light of a first wavelength into an optical waveguide, said light source comprising:

a first optical cavity comprising a bottom mirror located outside of said optical waveguide, and a top mirror comprising a reflector located within said optical waveguide; and an active region between said top and bottom mirrors for generating light of said first wavelength, wherein said optical waveguide is an optical fiber and said active region generates light by absorbing light of a second wavelength, said light source further comprising a pumping laser for generating light of said second wavelength, wherein said pumping laser includes a second optical cavity comprising a top mirror, active region, and bottom mirror, wherein said top mirror of said pumping laser is electrically connected to said bottom mirror of said first optical cavity, and wherein said active region of said pumping laser generates light in response to an electrical current passing therethrough.

10. The light source of claim 9 wherein said top mirror of said pumping laser is located on an end of said optical fiber.

* * * * *